United States Patent [19]
Fukui

[11] Patent Number: 6,114,906
[45] Date of Patent: Sep. 5, 2000

[54] DIFFERENTIAL AMPLIFIER CIRCUIT

[75] Inventor: Atsuo Fukui, Chiba, Japan

[73] Assignee: Seiko Instruments Inc., Japan

[21] Appl. No.: 09/275,697

[22] Filed: Mar. 24, 1999

[51] Int. Cl.[7] .................................. H03F 3/45; H03L 5/00
[52] U.S. Cl. .......................... 330/252; 330/253; 327/307
[58] Field of Search ................................... 330/252, 253, 330/261, 258; 327/307

[56] References Cited

U.S. PATENT DOCUMENTS

| | | | |
|---|---|---|---|
| 5,045,806 | 9/1991 | Yan ........................................ | 330/252 |
| 5,386,160 | 1/1995 | Archer et al. ........................... | 327/307 |
| 5,467,045 | 11/1995 | Tanigawa ................................ | 327/336 |
| 5,812,005 | 9/1998 | Ezell et al. ............................. | 330/261 |
| 5,942,936 | 8/1999 | Ricco et al. ............................ | 327/563 |

*Primary Examiner*—Robert Pascal
*Assistant Examiner*—Patricia T. Nguyen
*Attorney, Agent, or Firm*—Adams & Wilks

[57] ABSTRACT

To eliminate the offset voltage of a differential amplifier and ensure stable operation even when an input voltage is zero, a settable constant current source and a level shifting circuit are connected to at least one of the non-inverted and inverted input terminals of a differential amplifier. The constant current source produces a constant current that is set according to the offset voltage of the differential amplifier. In one embodiment, the level shifting circuit comprises a pair of depletion mode P-MOS transistors each connected in series to a settable constant current source, the respective series-connected pairs being connected to each input of the differential amplifier. The constant current source has a constant current value that may be varied by trimming using a laser or the like. By setting the output voltages of each such circuit equal, the offset voltage of the differential amplifier is eliminated.

21 Claims, 3 Drawing Sheets

DIFFERENTIAL AMPLIFIER CIRCUIT

BACKGROUND OF THE INVENTION

The present invention relates to a differential amplifier circuit of a semiconductor integrated circuit.

As a conventional differential amplifier circuit, there has been known a circuit shown in FIG. 5. That is, the conventional differential amplifier circuit is made up of a differential stage having input terminals 1, 2 a differential pair 100 including enhancement made P-MOS transistors 102 and 103 sources of which are connected to each other, a constant current source regions 106 one end of which is connected to the source of the differential pair and the other end of which is connected to a power supply Vdd, and a current mirror circuit 101 including enhancement mode N-MOS transistors 104 and 105. The gate of the enhancement mode P-MOS transistor 102 forming the differential pair 100 is connected to a non-inverted input terminal 1 whereas the gate of the enhancement mode P-MOS transistor 103 is connected to an inverted input terminal 2, and the respective drains of the enhancement mode P-MOS transistor 103 of the differential pair and the enhancement mode N-MOS transistor 105 of the current mirror circuit 101 are connected to an output 3.

In the case where a voltage VINP of the non-inverted input terminal 1 is larger than a voltage VINN of the inverted input terminal 2, a voltage VOUT of the output terminal 3 has a "HIGH" level, whereas in the case where VINP is smaller than VINN, VOUT has a "LOW" level.

The conventional differential amplifier circuit shown in FIG. 5 allows an offset voltage of about 10 mV to be developed, which leads to a serious defect of the CMOS differential amplifier circuit.

Also, in the conventional differential amplifier circuit shown in FIG. 5, in the case where the voltage at the non-inverted input terminal 1 or the inverse input terminal 2 is near GND, the enhancement mode P-MOS transistor 102 or 103 that forms the differential pair becomes in a non-saturated state, which leads to problems such as the more deterioration of offset voltage, the lowering of an operation speed, or an abnormality in operation.

SUMMARY OF THE INVENTION

In order to solve the above problems, the present invention provides a circuit for adjusting an offset voltage and a level shift circuit for preventing the enhancement P-MOS transistors of the differential pair from becoming in a non-saturated state.

DETAILED DESCRIPTION OF THE PREFERRED EMBODIMENTS

In the present invention, a constant current source that can vary a current value by trimming and a drain grounding circuit formed of tan enhancement mode P-MOS transistor are added to the respective inputs of the differential amplifier circuit.

Hereinafter, various preferred embodiments of the present invention will be described with reference to the drawings.

Figure 1:
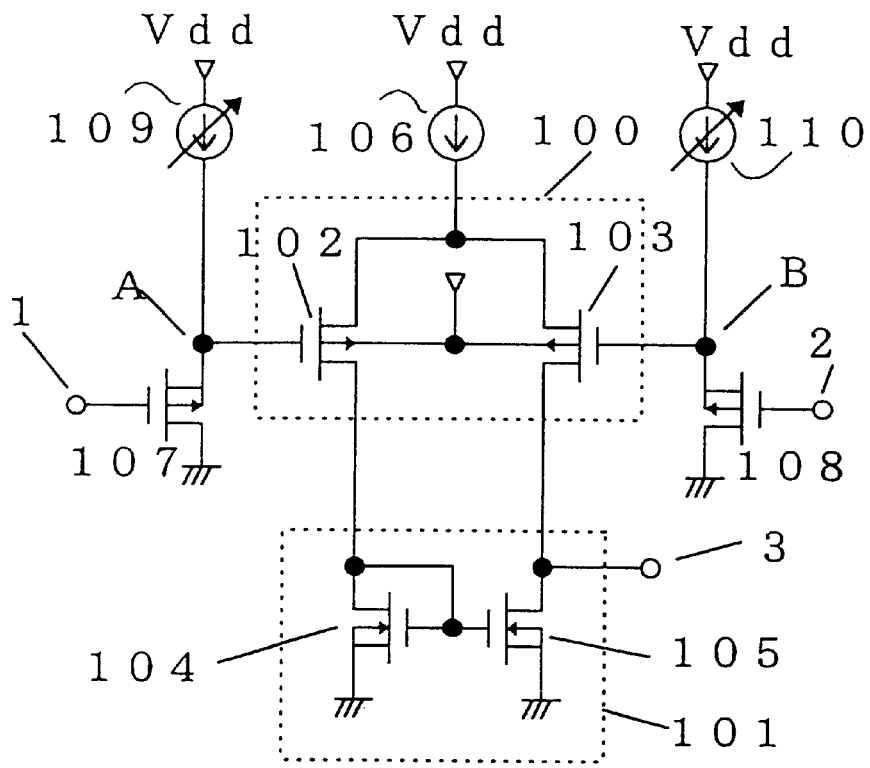
FIG. 1 shows a circuit diagram of a differential amplifier circuit in accordance with a first embodiment.

FIG. 1 shows a differential amplifier circuit in accordance with a first embodiment of the present invention. The differential amplifier circuit includes constant current sources 109 and 110 having a current value that can be varied by trimming using a laser or the like, and drain grounding circuits 107 and 108 made up of enhancement mode P-MOS transistors for performing a level shift, in addition to a differential pair 100 made up of enhancement mode P-MOS transistors 102 and 103, and a current mirror circuit 101 made up of enhancement mode N-MOS transistors 104 and 105. If it is assumed that an output current of the constant current source 109 in which the current can be varied is I109, a voltage VSG107 between the gate and the source of the enhancement P-MOS transistor 107 is given by expression (1).

$$VSG107 = Vtp + \sqrt{\frac{2}{\mu \cdot Cox} \cdot \frac{L}{W} \cdot I109} \quad (1)$$

Similarly, if it is assumed that an output current of the constant current source 110 in which the current can be varied is I110, a voltage VSG108 between the gate and the source of the enhancement mode P-MOS transistor 108 is given by expression (2).

$$VSG108 = Vtp + \sqrt{\frac{2}{\mu \cdot Cox} \cdot \frac{L}{W} \cdot I110} \quad (2)$$

Where Vtp is a threshold voltage of the enhancement mode P-MOS transistor, $\mu$ is mobility, Cox is the gate capacitance per unit area, L is a gate length, and W is a gate width.

With this in mind, if it is now assumed that the voltage at the non-inverse non-inverted input terminal 1 is VINP, and the voltage of the inverted input terminal 2 is VINN, voltages VA and VB at points A and B are given by the following expressions on the basis of expressions (1) and (2).

$$VA = VINP + VSG107 \quad (3)$$

$$VB = VINN + VSG108 \quad (4)$$

VA−VB at the time of VINP−VINN=0 is given by the following expression on the basis of expressions (3) and (4).

$$VA - VB = VSG107 - VSG108 \quad (5)$$

Expressions (1) and (2) are substituted for expression (5) to obtain the following expression.

$$VA - VB = \sqrt{\frac{2}{\mu \cdot Cox} \cdot \frac{L}{W} \cdot I109} - \sqrt{\frac{2}{\mu \cdot Cox} \cdot \frac{L}{W} \cdot I110} \quad (6)$$

If it is assumed that the offset voltage developed by the differential amplifier circuit shown in FIG. 1 is Vos, the entire offset voltage Vos (total) is given by the following expression.

$$Vos(\text{total}) = VA - VB - Vos \quad (7)$$

To set the entire offset voltage Vos (total) to 0, the following expression may be satisfied on the basis of expression (7).

$$Vos = VA - VB \qquad (8)$$

The satisfying the condition defined by expression (8) can cancel the offset voltage Vos developed by the differential amplifier circuit shown in FIG. 1, as a result of which the entire offset voltage Vos (total) can be set at 0.

That is, the value of I109 or I110 is adjusted by trimming means such as by cutting a fuse which will be described with reference to FIG. 2, use of a by laser so that the following expression is obtained from expressions (6) and (8), thereby enabling the entire offset voltage Vos (total) to be set to zero.

$$Vos = \sqrt{\frac{2}{\mu \cdot Cox} \cdot \frac{L}{W} \cdot I109} - \sqrt{\frac{2}{\mu \cdot Cox} \cdot \frac{L}{W} \cdot I110} \qquad (9)$$

Even if the non-inverted input terminal 1 or the inverted input terminal 2 is at GND, since the enhancement mode P-MOS transistors 107 and 108 conduct level shift, VA=VSG 107 and VB=VSG 108 (VA and VB are normally about 0.8 V) are satisfied as is apparent from expressions (3) and (4). As a result, there is no case in which the enhancement mode P-MOS transistor 102 or 103 of the differential pair 100 becomes in a non-saturated state. Accordingly, there is no case in which the deterioration of the offset voltage, the lowering of an operation speed, the abnormality of operation or the like is induced when VINP or VINN is near GND as is found in the conventional differential amplifier circuit.

Expression (8) exhibits the conditions for setting the entire offset voltage at zero. However, it is apparent that the entire offset voltage Vos (total) can be set at not only zero but also any arbitrary value by adjusting the currents I109 and I110 of the constant current sources 109 and 110 appropriately.

Figure 2:
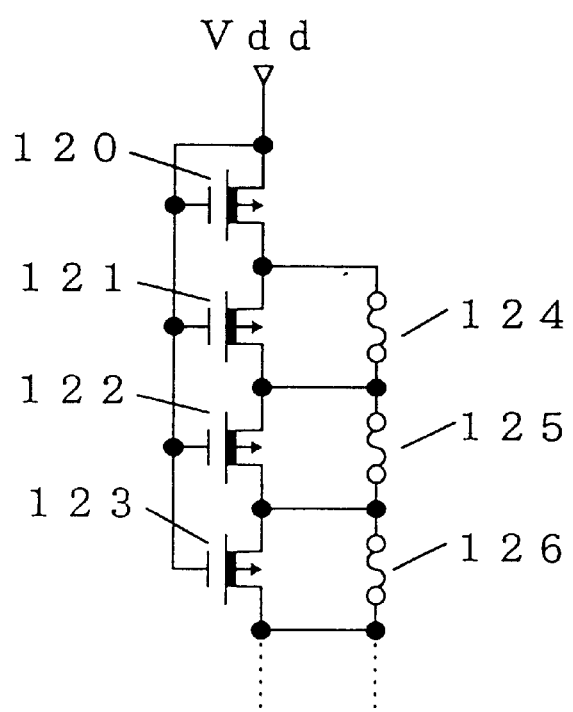
FIG. 2 shows a circuit diagram of constant current sources that can adjust a current by use of a laser.

FIG. 2 shows an embodiment of the constant current sources 109 and 110 that have a variable current that is adjusted by use of laser. The total channel length L of a the depletion mode P-MOS transistors 120 to 123 is adjusted by cutting fuses 124 to 126 with the laser, thereby being capable of changing an output current. With the structure in which the arbitrary number of fuses and depletion mode P-MOS transistors are further connected in series, the output current can be adjusted more accurately.

Figure 3:
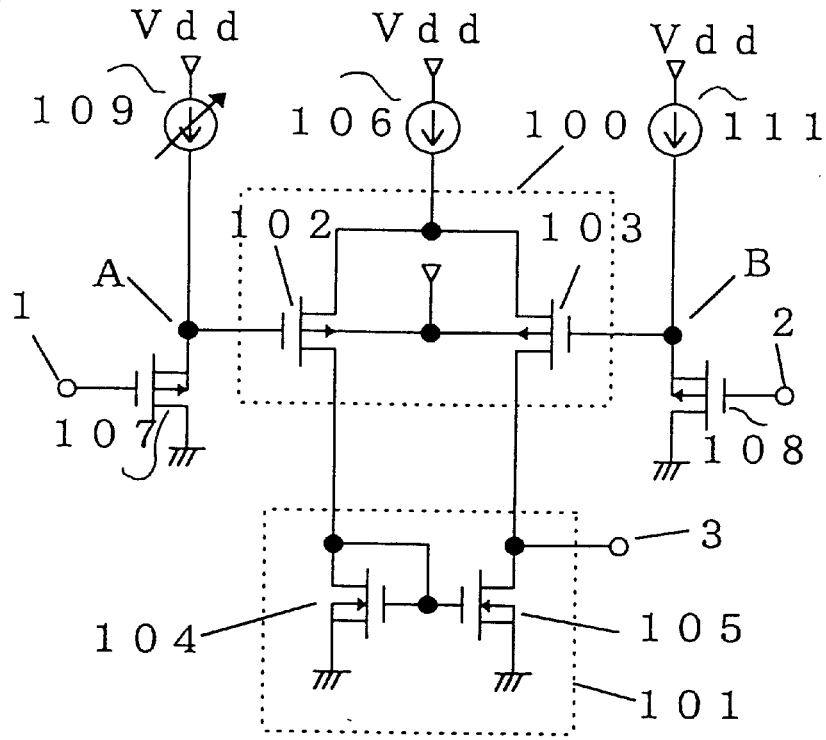
FIG. 3 shows a circuit diagram of a differential amplifier circuit in accordance with a second embodiment of the present invention.

FIG. 3 shows a differential amplifier circuit in accordance with a second embodiment of the present invention. A difference between the second embodiment and the first embodiment resides in the fart that a constant current source 111 having a fixed current value of is used in FIG. 3 replace the constant current source 110 having a variable current by use of a laser or the like as used in FIG. 1. Similarly, it is apparent that the second embodiment can obtain the same effect as that of the first embodiment. Also, it is apparent that the same effect as that of the second embodiment shown in FIG. 3 can be obtained even in the case where a constant current source a current value of which is fixed is replaced by the constant current source 109 that can adjust the current by use of laser or the like in FIG. 1.

Figure 4:
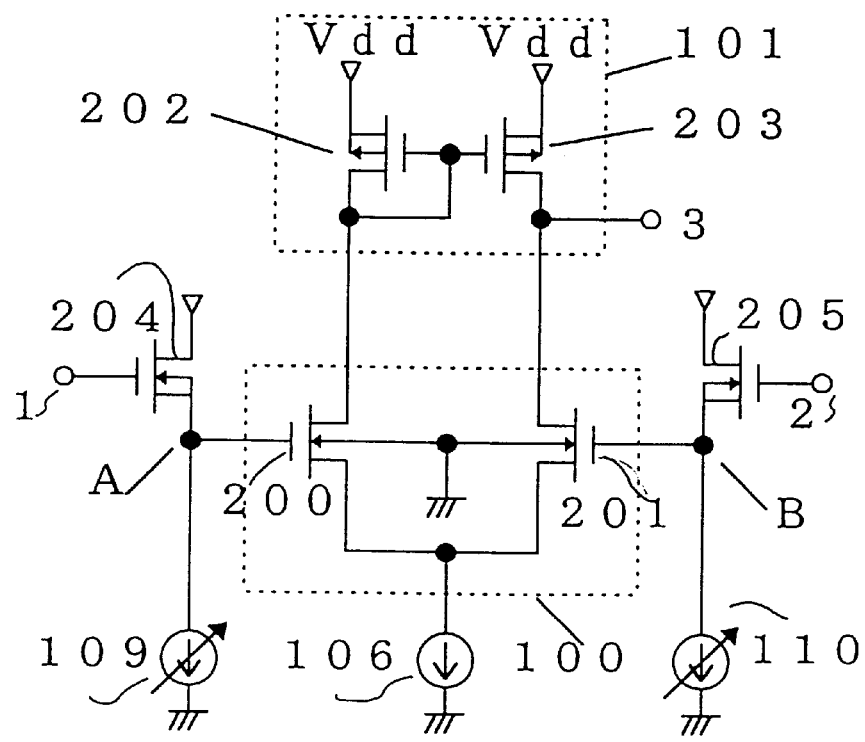
FIG. 4 shows a circuit diagram of a differential amplifier circuit in accordance with a third embodiment of the present invention.
Figure 5:
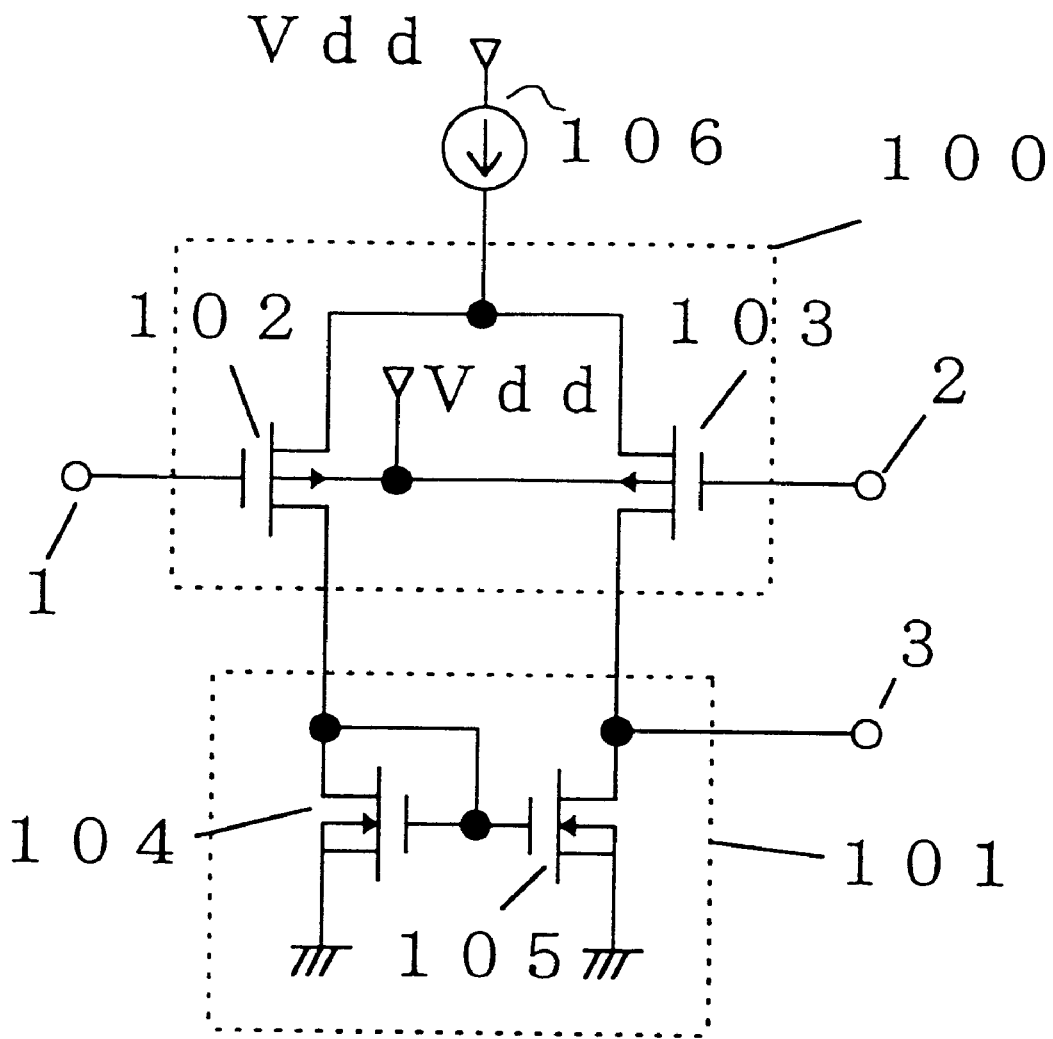
FIG. 5 shows a circuit diagram of a conventional differential amplifier circuit.

FIG. 4 shows a differential amplifier circuit in accordance with a third embodiment of the present invention. The differential amplifier circuit includes constant current sources 109 and 110 having a current value that can be varied by trimming using a laser or the like, and drain grounding circuits 204 and 205 made up of enhancement mode N-MOS transistors for performing level shift, in addition to a differential pair 100 made up of enhancement mode N-MOS transistors 200 and 201, and a current mirror circuit 101 made up of enhancement mode P-MOS transistors 202 and 203.

Similarly, in FIG. 4, it is apparent that the offset voltage can be adjusted by adjusting the currents I109 and I110 of the constant current sources 109 and 110 by trimming. On the other hand, the third embodiment is different from the first embodiment in that there is no case in which the deterioration of the offset voltage, the lowering of an operation speed, the abnormality of operation or the like is induced when the voltage VINP at the non-inverted input terminal 1 or the voltage VINN at the inverted input terminal 2 is near Vdd.

In FIG. 4, it is apparent that the same effect is obtained even if a constant current source having a current that can be varied by using laser or the like is used for only one of the constant current sources 109 and 110, and a constant current source a of a fixed current value is used for the other constant current source 109 or 110.

In the differential amplifier circuit according to the present invention, the characteristics are not deteriorated even by an input voltage which is near GND, and the offset voltage can be set at an arbitrary value by using the trimming technique.

What is claimed is:

1. A differential amplifier circuit comprising: a settable constant current source for producing a constant current that may be set to a desired value by trimming; a level shifting circuit connected in series with the settable constant current source; and a differential amplifier connected to the constant current source and the level shifting circuit; wherein the current value of the settable constant current source is set according to an offset voltage value of the differential amplifier.

2. A differential amplifier circuit according to claim 1; wherein the current value of the settable constant current source is set to a value sufficient to cancel the offset voltage of the differential amplifier.

3. A differential amplifier circuit according to claim 1; wherein the differential amplifier comprises a differential stage having a first input terminal for receiving a non-inverted voltage, a first transistor having a gate electrode connected to the first input terminal, a second input terminal for receiving an inverted voltage, a second transistor having a gate electrode connected to the second input terminal, a current mirror circuit comprising a third transistor having a drain electrode connected to a drain electrode of the first transistor and a fourth transistor having a drain electrode connected to a drain electrode of the second transistor, and a second constant current source for supplying a constant current to a source electrode of the first and second transistors, so that a differential voltage proportionate to a difference between the inverted and non-inverted voltages is output at the interconnected drain electrodes of the second and fourth transistors.

4. A differential amplifier circuit according to claim 3; wherein the first and second transistors comprise enhancement mode P-MOS transistors and the third and fourth transistors comprise enhancement mode N-MOS transistors.

5. A differential amplifier circuit according to claim 1; wherein the settable constant current source comprises a plurality of series-connected transistors connected to a source voltage, and a fuse connected in parallel with at least one of the series-connected transistors to short-circuit the respective series-connected transistor; whereby the constant current value may be set to a desired value by opening at least one fuse so that the transistor connected in parallel therewith is not short-circuited.

6. A differential amplifier circuit according to claim 5; wherein the series-connected transistors comprise depletion mode N-MOS transistors.

7. A differential amplifier circuit according to claim 1; wherein the differential amplifier comprises a differential stage having a pair of input terminals, the settable constant current source and the level shifting circuit are connected to at least one of the input terminals, and the constant current is set to a value sufficient to cancel an offset voltage of the differential amplifier.

8. A differential amplifier circuit according to claim 7; wherein the differential stage comprises at least a pair of transistors each being connected to a respective input terminal, and the level shifting circuit is connected to a gate electrode of at least one of the pair of transistors to prevent the transistor from entering a non-saturated state.

9. A differential amplifier circuit according to claim 1; wherein the differential amplifier comprises a differential stage having a pair of input terminals, the settable constant current source comprises a first constant current source connected to one of the input terminals and a second constant current source connected to the other input terminal, at least one of the first and second constant current sources having a constant current that may be set to a desired value by trimming so that the offset voltage of the differential amplifier may be canceled.

10. A differential amplifier circuit according to claim 9; wherein the level shifting circuit comprises a first level shifting circuit connected to one of the input terminals and a second level shifting circuit connected to the other input terminal.

11. A differential amplifier circuit according to claim 1; wherein the differential amplifier comprises a differential stage having a first input terminal for receiving a first voltage, a first transistor connected to the first input terminal, a second input terminal for receiving a second voltage and a second transistor connected to the second input terminal, a current mirror circuit comprising a third transistor connected to the first transistor and a fourth transistor connected to the second transistor, and a second constant current source for supplying a fixed constant current to the first and second transistors; wherein the settable constant current source comprises at least a first settable constant current source connected to the first input terminal, and the level shifting circuit comprises at least a first level shifting circuit connected to the first input terminal for preventing the first transistor from entering into a non-saturated state.

12. A differential amplifier circuit according to claim 11; wherein the first settable constant current source has a constant current set to a value sufficient to cancel the offset voltage of the differential amplifier.

13. A differential amplifier circuit according to claim 11; wherein the settable constant current source further comprises a second settable constant current source connected to the second input terminal, and the level shifting circuit further comprises a second level shifting circuit connected to the second input terminal for preventing the first transistor from entering into a non-saturated state.

14. A differential amplifier circuit according to claim 13; wherein the second settable constant current source has a constant current set to a value sufficient to cancel the offset voltage of the differential amplifier.

15. A differential amplifier circuit according to claim 13; wherein the constant currents produced by the first and second settable constant current sources are set to values sufficient to cancel the offset voltage of the differential amplifier.

16. A differential amplifier according to claim 11; wherein the settable constant current source further comprises a second non-settable constant current source connected to the second input terminal.

17. A differential amplifier circuit according to claim 11; wherein the level shifting circuit comprises a fifth transistor connected to the first input terminal and a sixth transistor connected to the second input terminal, the fifth and sixth transistors being connected so as to prevent the first and second transistors from entering into a non-saturated state when one of the first and second input voltages approaches a ground level.

18. A differential amplifier circuit according to claim 1; wherein the constant current value of the settable constant current source is set so as to cancel an offset voltage of the differential amplifier.

19. A differential amplifier circuit comprising: a differential stage having a pair of input terminals for receiving a pair of input voltages; a current mirror circuit connected to the differential stage; a settable constant current source for supplying a constant current to the differential stage, the constant current being set according to a value of an offset voltage produced by the differential stage and the current mirror circuit; and a level shifting circuit connected in series with the settable constant current source for preventing a transistor in the differential stage from entering into a non-saturated state.

20. A differential amplifier circuit according to claim 19; wherein the settable constant current source and the level shifting circuit are connected to at least one of the input terminals.

21. A differential amplifier circuit according to claim 19; wherein the constant current value is set so as to cancel the offset voltage produced by the differential stage and the current mirror circuit.

* * * * *